United States Patent [19]

Capper et al.

[11] Patent Number: 4,551,196
[45] Date of Patent: Nov. 5, 1985

[54] METHOD OF GROWING CRYSTALLINE CADMIUM MERCURY TELLURIDE AND CRYSTALLINE CADMIUM MERCURY TELLURIDE GROWN BY THE METHOD

[75] Inventors: Peter Capper; John J. Gosney, both of Southampton, England

[73] Assignee: U.S. Philips Corporation, New York, N.Y.

[21] Appl. No.: 433,131

[22] PCT Filed: May 14, 1982

[86] PCT No.: PCT/GB82/00148
§ 371 Date: Sep. 27, 1982
§ 102(e) Date: Sep. 27, 1982

[87] PCT Pub. No.: WO82/04073
PCT Pub. Date: Nov. 25, 1982

[30] Foreign Application Priority Data

May 15, 1981 [GB] United Kingdom ............... 8114911

[51] Int. Cl.$^4$ .............................................. C30B 21/02
[52] U.S. Cl. .............................................. 156/616 R
[58] Field of Search ............... 156/616 R, DIG. 72, 156/DIG. 82

[56] References Cited

PUBLICATIONS

Bartlett et al., Jl. of Crystal. Growth 46, (1979), pp. 23-29.
Scheel et al., Jl. of Crystal. Growth 8, (1971), pp. 304-306.

Primary Examiner—Hiram H. Bernstein
Attorney, Agent, or Firm—Norman N. Spain

[57] ABSTRACT

A method of growing crystalline cadmium mercury telluride by a vertical Bridgman process. A problem in growing such crystalline material is to produce significant quantities of material which are both of acceptable crystal quality and are of homogeneous composition. A melt of cadmium mercury telluride is prepared in a sealed ampoule, and the crystalline cadmium mercury telluride is grown from the melt by a vertical Bridgman process at a rate of from 0.1 to 2 mm per hour. During growth the ampoule is subjected to an accelerated crucible rotation programme which comprises the steps of accelerating the rate of rotation of the ampoule about is longitudinal axis and decelerating the rate of rotation of the ampoule.

4 Claims, 6 Drawing Figures

METHOD OF GROWING CRYSTALLINE CADMIUM MERCURY TELLURIDE AND CRYSTALLINE CADMIUM MERCURY TELLURIDE GROWN BY THE METHOD

The invention relates to a method of growing crystalline cadmium mercury telluride, the method comprising the steps of preparing a melt of cadmium mercury telluride in a sealed ampoule, and growing the crystalline cadmium mercury telluride from the melt by a vertical Bridgman process. Throughout this specification a vertical Bridgman process is understood to be a process in which a crystal is grown by slowly lowering a sealed ampoule containing a melt through a temperature gradient extending in a vertical direction so that crystallization begins at the bottom of the ampoule. The invention also relates to crystalline cadmium mercury telluride grown by this method.

When manufacturing semiconductor devices from a ternary semiconductor compound, a significant problem is to obtain adequate quantities of the crystalline ternary compound within a given range of compositions so as to provide material having desired properties, for example in the case of cadmium mercury telluride used in the detection of infra-red radiation, desired electro-optic properties. The usefulness of this crystalline material also depends on imperfections in the material.

The Accelerated Crucible Rotation Technique (A.C.R.T.) was proposed by H. J. Scheel and E. O. Schulz-Dubois in an article "Flux Growth of Large Crystals by Accelerated Crucible-Rotation Technique" in Journal of Crystal Growth 8 (1971) pp. 304–306. A.C.R.T. has been used in various crystal growth processes, for example in Czochralski growth and in solution and flux growth processes conducted in sealed containers. Problems of high vapour pressure of solvents used for the growth of crystals from high temperature solutions necessitated the use of sealed containers, and this prevented the use of normal stirring techniques. The main improvement in using A.C.R.T. in such cases has usually been to increase the size of the crystals grown by reducing nucleation, when compared with growth without stirring. Faster stable growth rates can be used because of the reduction of the thickness of the diffusion boundary layer induced by the stirring effects. A.C.R.T. has been used in Czochralski growth, for example to control the oxygen content gradient in silicon crystals, described in U.S. Pat. No. 4,040,895.

F. V. Wald and R. O. Bell describe (in Journal of Crystal Growth 30 (1974) pages 29–36) a travelling heater method of solution growth of CdTe from a solution in tellurium which was subjected during growth to A.C.R.T. The results obtained by this method showed that A.C.R.T. was only of modest effect (it could only increase the growth rate for which inclusion-free crystals could be obtained by a factor of two), because the natural convection currents generated under the particular experimental conditions were already very strong indeed. Furthermore, it was found that the undesirable tendency of CdTe crystals grown by this method to twin, form stacking faults or low angle grain boundaries, was still present when using A.C.R.T.

BRIEF DESCRIPTION OF THE DRAWINGS

In the accompanying drawings,

An ingot of cadmium mercury telluride grown at a rate of 0.5 mm per hour by a vertical Bridgman process from a melt having an initial composition $Cd_{0.19}Hg_{0.81}Te$ and contained in an ampoule which was rotated during growth continuously at 2 r.p.m. has an axial composition (expressed as x mole % CdTe) as shown by curve A in FIG. 1. Due to the segregation of cadmium telluride with respect to mercury telluride, there is a variation in the composition along the length of the ingot. When material within a narrow range of compositions is required, the yield of such material from a single ingot grown by this method is low. Referring to FIG. 2, curve C is the radial composition variation $\Delta x$ of cadmium mercury telluride of this ingot plotted against $\lambda_e$, the cut-on wavelength on the axis of the ingot at 300K. It will be evident when considering curves A and C together that the yield of useful material grown by this method is low.

Figure 1:
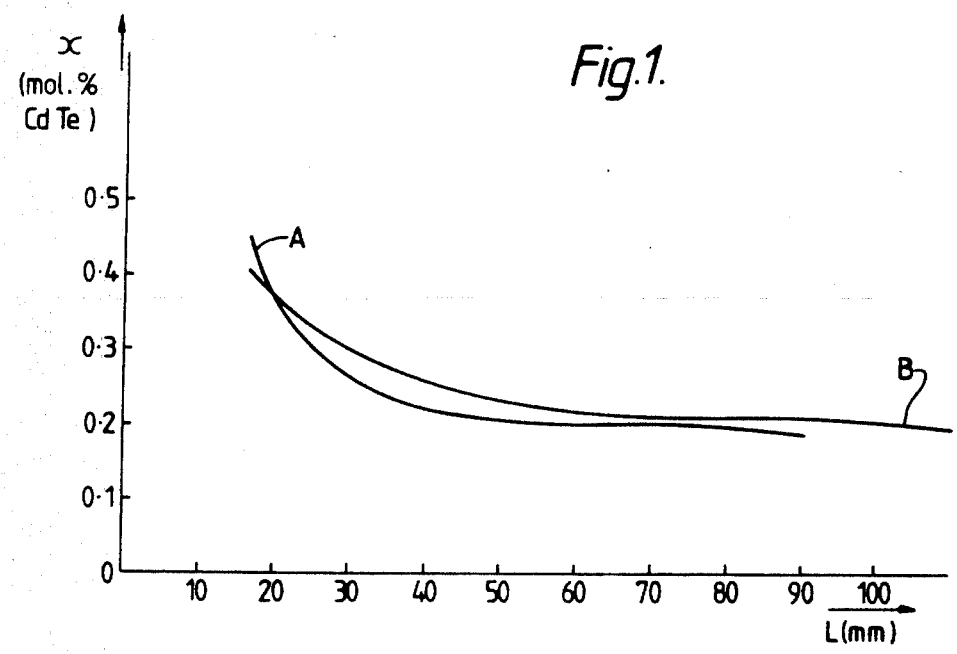
FIG. 1 is a graph on which the molar fraction x of CdTe in $Cd_xHg_{1-x}Te$ ingots grown from melts having an initial composition $Cd_{0.19}Hg_{0.81}Te$ is plotted against L, the distance from the tip of the ingot.

The object of the invention is to provide a method of growing crystalline cadmium mercury telluride having improved compositional homogeneity.

The invention is characterized in that the crystalline cadmium mercury telluride is grown at a rate of from 0.1 to 2 mm per hour, that during growth of the crystalline cadmium mercury telluride the ampoule is subjected to a periodic accelerated crucible rotation programme, and that this programme comprises the steps of accelerating the rate of rotation of the ampoule about its longitudinal axis and decelerating the rate of rotation of the ampoule.

In order to optimise the yield of homogeneous material produced, it is preferred that the maximum rate of rotation of the ampoule is from 10 to 100 revolutions per minute, and that the acceleration and deceleration of the rates of rotation of the ampoule are from 5 to 40 revolutions per minute per second. The ampoule may be rotated in one direction.

Said accelerated crucible rotation programme may comprise the steps of accelerating the rate of rotation of the ampoule from zero to a given rotation rate, rotating the ampoule at this given rotation rate for a predetermined period, decelerating the rate of rotation to zero, accelerating the rate of rotation in a reverse direction to a given rotation rate, rotating the ampoule at this given rotation rate for a predetermined period, and decelerating the rate of rotation of the ampoule to zero. A similar A.C.R.T. programme may be used without reversing the direction of rotation of the ampoule. The ampoule may be rotationally stationary for a predetermined period between the steps of decelerating and accelerating said rotation rate. The bottom of the ampoule may be, for example conical, substantially hemispherical or flat. The following Table defines a preferred series of A.C.R.T. programmes suitable for use with Bridgman ampoules in a method according to the invention.

TABLE

| Direction | Acceln. period | Constant 10–100 rpm | Deceln. period |
| --- | --- | --- | --- |
| Clockwise | 1 to 20s | 1 to 360s | 1 to 20s |
| Stop | | 1 to 45s | |
| Anti-clockwise | 1 to 20s | 1 to 360s | 1 to 20s |
| Stop | | 1 to 45s | |

The method according to the invention may be used for example, for growing crystalline cadmium mercury telluride having compositions defined by the formula $Cd_xHg_{1-x}Te$, where $0.4 \geq x \geq 0.15$. During the investigations which led to the present invention, the effects of the growth rate of crystalline cadmium mercury telluride grown by a vertical Bridgman process on the axial and radial compositions of the grown material were examined. The ampoules used in these experiments were rotated at a constant rate of 2 revolutions per minute, and different growth rates from 0.25 to 5 mm per hour were used. It was found that when using slow growth rates, it was possible to obtain substantially homogeneous radial compositional homogeneity, but then large axial composition variations were produced. At high growth rates, there was an accumulation of mercury telluride in front of the growth interface, whereas at slow growth rates mixing of the liquid phases occurred which dispersed the mercury telluriderich layer. When a cadmium mercury telluride melt is adequately mixed so that there is always equilibrium throughout the melt, when the melt is cooled, the melt composition will follow the liquidus line and the solid composition follows the solidus line in a pseudobinary phase diagram of the system CdTe-HgTe (see, for example, J. L. Schmit and C. J. Speerschneider, Infrared Phys. 8 (1968) 247. Therefore there will always be pronounced segregation in an equilibrium growth situation. If a cadmium mercury telluride melt is frozen from one end, as in a vertical Bridgman process, equilibrium growth produces a continuously changing axial solid composition. The Applicants have discovered that at growth rates of from 0.1 to 'mm per hour in a vertical Bridgman process of growing crystalline cadmium mercury telluride, by using an A.C.R.T. programme to produce mixing of the melt which is less than that which would result in the occurrence of equilibrium growth, it is possible to produce crystalline cadmium mercury telluride which has a substantially constant axial and radial compositional homogeneity over a significantly greater length of the crystalline material than it has previously been possible to achieve.

The compositions of crystalline cadmium mercury telluride $Cd_xHg_{1-x}Te$ which has desired electro-optic properties when using infra-red radiation having wavelengths in the ranges between 3 and 5 $\mu m$, and between 8 and 13 $\mu m$, have respective values of x of approximately 0.30 and approximately 0.21. The yield from a particular ingot material having desired properties depends on the longitudinal composition profile, the radial composition profile and the crystal quality of the material.

During the investigations which led to the present invention simulation studies were carried out to determine the flows existing in ampoules used in a Bridgman crystal growth process under the influence of A.C.R.T. The three possible processes occurring during accelerated/decelerated rotation are fast processes compared to normal convection. A transient form of Couette flow occurs exclusively during deceleration of the ampoule, and this type of flow is enhanced when using a relatively full ampoule. During rapid deceleration of the ampoule, the inner liquid rotates faster than the outer liquid close to the wall. Centrifugal forces drive the inner liquid towards the wall, resulting in very significant mixing of the melt at the container wall, affecting crystallinity, and radial uniformity of compositon. The Couette flow reduces spontaneous nucleation occurring at the container walls.

During acceleration or deceleration of liquid in an ampoule, spiral shearing of the liquid occurs, like transient Couette flow, because the rotation of liquid closest to the container wall changes more quickly than the inner volumes of liquid. Mixing in the bulk of the liquid is predominantly due to Ekman flow and spiral shearing.

Ekman-layer flow occurs in a liquid in the vicinity of a solid boundary extending perpendicular to the rotational axis of the ampoule. During acceleration of the ampoule, an Ekman layer forms just above the base of the ampoule, within which layer there is a fast radial flow of liquid. This liquid is forced up the side walls of the ampoule and returns more slowly through the bulk of the liquid before re-entering the Ekman layer. The flow is reversed during deceleration of the ampoule. The conical shape of a normal Bridgman ampoule results in a stagnant region which is unaffected by either acceleration or deceleration of the ampoule.

During acceleration of the ampoule, there is a strong, downward, central flow of liquid, a rapid flow across the base, and a spiral flow up the wall. In an ampoule having a flat bottom, a stable flow cell is set up at the junction of the base and side wall. During deceleration, there is a mushroom-shaped flow of liquid from the base. There is thus a large movement of liquid in the vertical direction during a single A.C.R.T. cycle.

In the growth of cadmium mercury telluride, the Ekman flow will have a tendency to even out any HgTe segregation in a radial direction. In a normal Bridgman process not using A.C.R.T., HgTe has a tendency to sink to the bottom of the concave liquid-solid interface.

It was found that when using a method according to the invention to grow cadmium mercury telluride ingots, that the yield of material which could be used for making infra-red detectors was about 10 times the yield obtained when using a Bridgman process without A.C.R.T. This was due both to the improvement in the homogeneity of composition and to the improved crystal quality of the material. Furthermore it was found that when using a method in accordance with the invention, there was a complete absence of twinning and there were fewer low angle grain boundaries than when using the prior art Bridgman process of growing crystalline cadmium mercury telluride.

Some embodiments of the invention produced by methods according to the invention will now be described with reference to the Examples and to the drawings.

EXAMPLE 1

Figure 3:
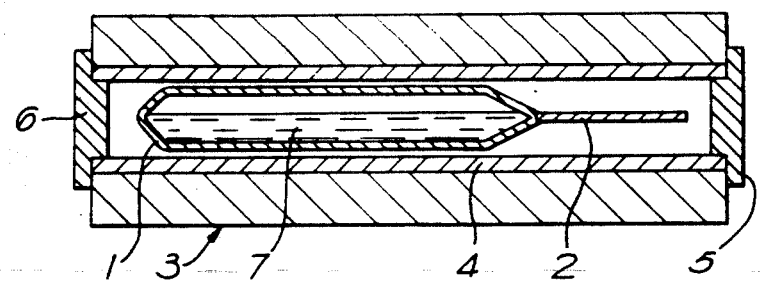
FIG. 3 is a schematic longitudinal section of a rocking furnace.

74.2986 g of mercury, 10.0285 g of cadmium and 59.9176 of tellurium were placed in a 300 mm long silica ampoule 1 having an internal diameter of 13±0.5 mm, a wall thickness of 3±0.5 mm, and having a bottom of a conical shape which is conventionally used in vertical Bridgman growth processes. The charge in the ampoule corresponded to a composition $Cd_{0.19}Hg_{0.81}Te$, but with a 2 g mercury deficiency. The ampoule 1 was evacuated and sealed, and had a 10 mm diameter silica rod 2 sealed to the bottom end. The sealed ampoule 1 was placed in a conventional rocking furnace 3 (shown schematically in FIG. 3). The rocking furnace 3 had an alumina furnace tube 4 which was closed at each end by alumina plugs 5, 6 which served to reduce the heat loss from the ends of the furnace. The ampoule 1 was heated to 500° C. in 1 hour, and the temperature of the ampoule 1 was then raised to 825° C. over a period of 24 hours and maintained at this temperature for 2 hours. The furnace was rocked ±5° about the horizontal at a rate of one cycle every 2 hours during the heating process in order to form a homogeneous melt 7. The ampoule 1 was then cooled.

Figure 4:
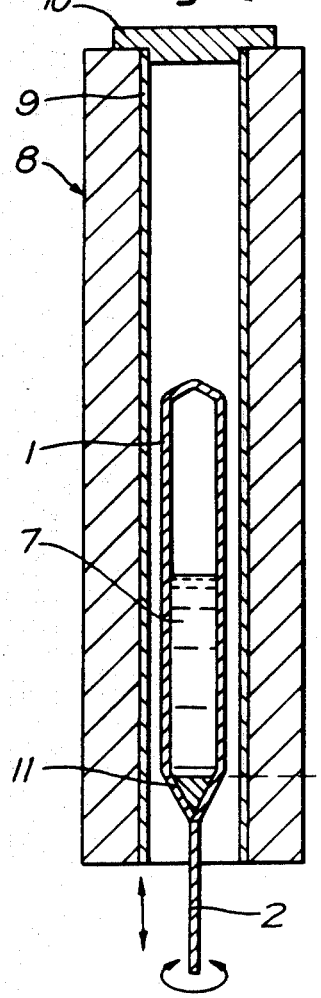
FIG. 4 is a schematic side-sectional elevation of a furnace used for growing crystalline cadmium mercury telluride by a method according to the invention.
Figure 5:
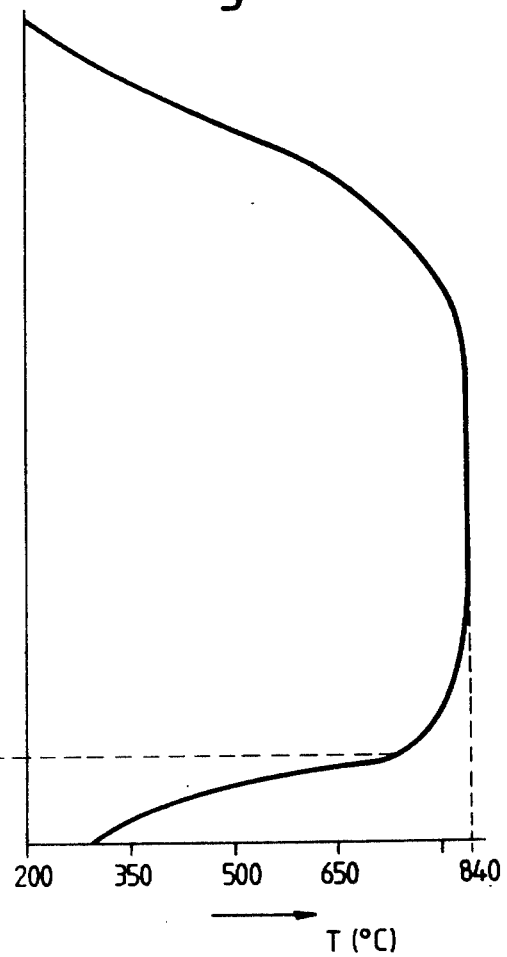
FIG. 5 is a longitudinal temperature profile of the furnace shown in FIG. 4.

The cooled ampoule 1 was then transferred to a vertically disposed tubular electric furnace 8 (FIG. 4). The furnace 8 comprised a stainless steel tube 9 closed at its upper end by a ceramic plug 10. The ampoule 1 was placed inside the furnace tube 9, and was supported by means of the silica rod 2 which was connected to a mechanical drive mechanism (not shown). This mechanism consisted of a variable slow speed motor and of a raise/lower mechanism. Initially the entire charge 7 in the ampoule 1 was disposed in a region in the furnace 8 in which the temperature was sufficiently high for all the cadmium mercury telluride to be molten. The ampoule 1 was then subjected to a periodic A.C.R.T. programme in which the ampoule was accelerated from rest to 60 r.p.m. at a rate of increase of 16 r.p.m. per second, maintained at a constant rate of 60 r.p.m. for 8 seconds, decelerated to rest at a rate of decrease of 16 r.p.m. per second, maintained rotationally stationary for 1 second, accelerated to 60 r.p.m. in the reverse direction at a rate of increase of 16 r.p.m. per second, maintained at a constant rate of 60 r.p.m. for 8 seconds, then decelerated to rest at a rate of decrease of 16 r.p.m. per second, and maintained rotationally stationary for 1 second. The programme was then repeated throughout the growth period. The ampoule 1 was lowered at a steady rate of 0.5 mm per hour as in a conventional vertical Bridgman process. The molten charge 7 began to form an ingot 11 at the tip of the conical portion of the ampoule 1, and growth proceeded until all the molten material had solidified. The ingot 11 passed through a temperature gradient of 6 deg. C. per mm which extended from 750° C. to 700° C. FIG. 5 shows the longitudinal temperature profile of the vertical furnace 8, and this is the classical Bridgman temperature profile.

Figure 2:
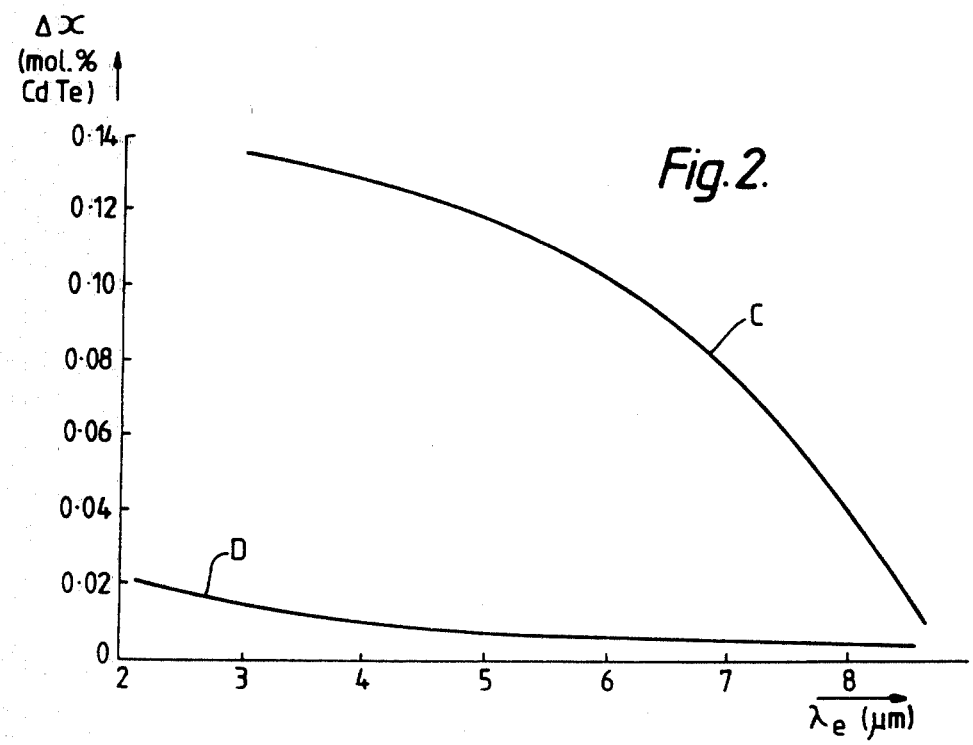
FIG. 2 is a graph in which the radial composition variation of cadmium mercury telluride ingots produced from melts having an initial composition of $Cd_{0.19}Hg_{0.81}Te$ is plotted against $\lambda_e$.

FIG. 1 shows the axial variation of x (the CdTe content of cadmium mercury telluride) with L (mms), the distance from the conical tip of the ingot. Curve B relates to the ingot produced by the above-described method using the specified A.C.R.T. programme, and curve A relates to a comparative process which differed only in that the ampoule was rotated throughout growth at a constant speed of 2 r.p.m. FIG. 2 is a graph on which the radial composition variation $\Delta x$ (mole % CdTe) is plotted against the cut-on wavelength $\lambda_e$ at the centre of a slice. Curve D relates to the ingot produced by the above-described method using the specified A.C.R.T. programme and curve C relates to the ingot produced by the comparative process. It will be evident from FIGS. 1 and 2 that the material grown using the A.C.R.T. programme contains a significant quantity of material which is useful for the 3 to 5 μm range, as well as a much greater quantity of material suitable for use in the 7 to 8 μm range (at 20° C.), that is for 8 to 13 μm at 77K, than is produced by a similar vertical Bridgman process in which the ampoule is rotated at a constant speed of 2 revolutions per minute. This is due to greatly improved radial homogeneity achieved by using the A.C.R.T. programme.

EXAMPLE 2

An ampoule 1 was charged with 6.0551 g of cadmium, 77.2450 g of mercury and 57.2813 g of tellurium. This charge corresponded to a composition $Cd_{0.12}Hg_{0.88}Te$ but with a 2 g mercury deficiency. An ingot was produced from this charge by a method similar to that used in Example 1, except that a different A.C.R.T. programme was used. The same accelerations and decelerations (16 r.p.m. per second) and the same constant rotational rate (60 r.p.m.) were used. The period for rotation at a constant rate was in each case 120 seconds, and the periods for which the ampoule was rotationally stationary was in each case 30 seconds.

Figure 6:
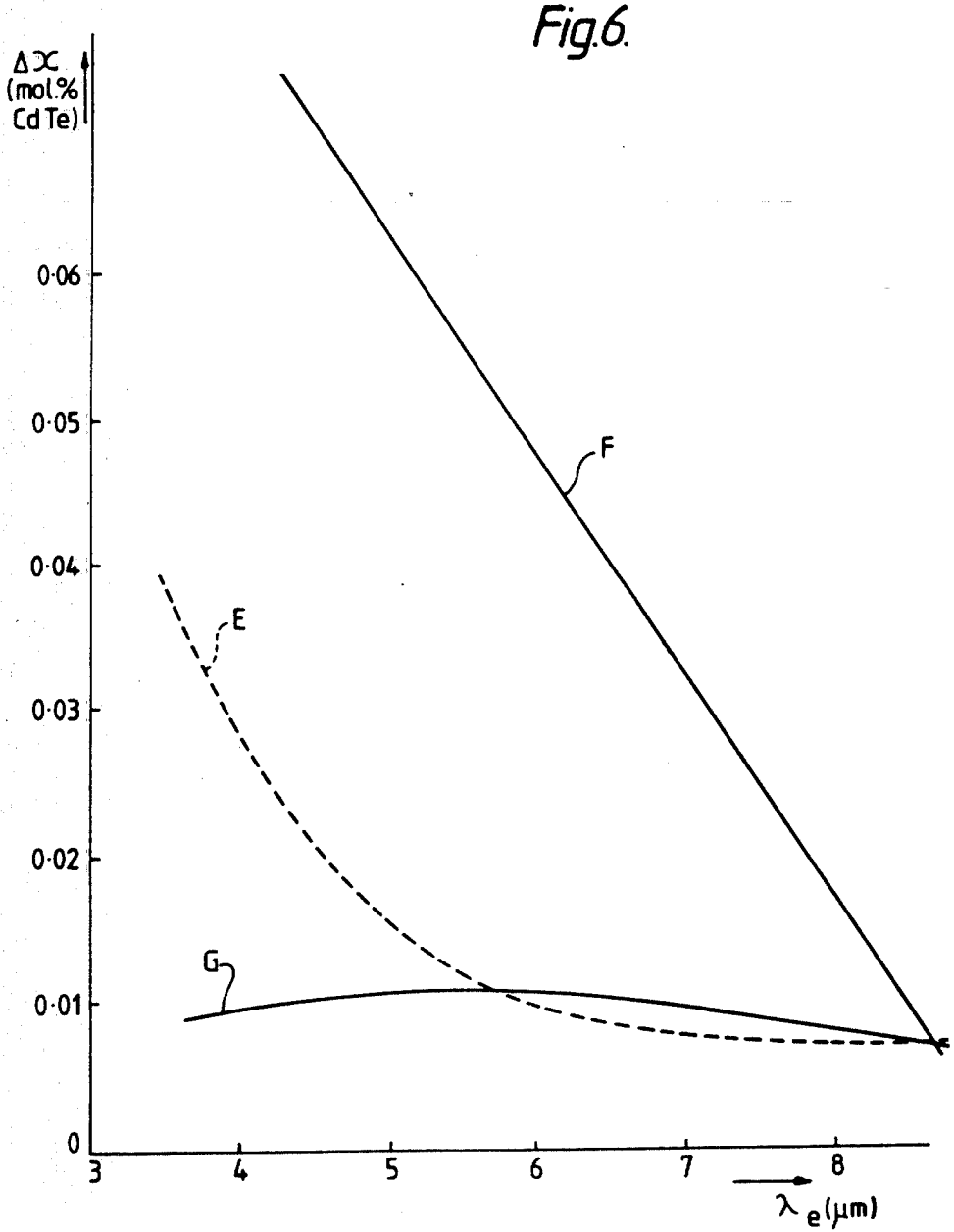
FIG. 6 is a graph in which the radial composition variation of cadmium mercury telluride ingots produced from melts having an initial composition of $Cd_{0.12}Hg_{p.88}Te$ is plotted against $_e$.

FIG. 6 is a graph on which the radial composition variation $\lambda_e$ (mole % CdTe) is plotted against the cut-off wavelength $\lambda_e$ at the centre of a slice. Curve E relates to the ingot produced by the above-described method using the specified A.C.R.T. programme, and curve F relates to an ingot produced by a comparative process in which the same starting composition was used but the ampoule was rotated throughout growth at a constant speed of 2 r.p.m.

EXAMPLE 3

The same process was used as described in Example 2 with A.C.R.T., except that the ampoule used had a flat bottom.

Curve G in FIG. 6 shows the plot of the radial composition variation $\Delta x$ (mole % CdTe) against $\lambda_e$.

It will be noted that the use of an ampoule having a flat bottom in a method according to the invention, gives some improvement in the radial homogeneity of the composition of the cadmium mercury telluride compared with the material grown under similar conditions when using an ampoule having a conical bottom. However, this improvement is small compared with the improvement gained by using an ampoule having a conical bottom and subjected to an A.C.R.T. programme over using a similar ampoule rotated during growth at a constant speed of 2 r.p.m.

We claim:

1. A method of growing crystalline cadmium mercury telluride, the method comprising the steps of preparing a melt of cadmium mercury telluride in a sealed ampule and growing the crystalline cadmium mercury telluride from the melt by a vertical Bridgman process, characterized in that the crystalline cadmium mercury telluride is grown at the rate of from 0.1 to 2 mm per hour, and that during growing of the cadmium mercury telluride crystal said ampule is subjected to the following accelerated ampule rotation program:

| Direction | Acceln. period | Constant 10–100 rmp | Deceln. period |
|---|---|---|---|
| Clockwise | 1 to 20 s | 1 to 360 s | 1 to 20 s |
| Stop | | 1 to 45 s | |

-continued

| Direction | Acceln. period | Constant 10-100 rmp | Deceln. period |
| --- | --- | --- | --- |
| Anti-Clockwise | 1 to 20 s | 1 to 360 s | 1 to 20 s |
| Stop | | 1 to 45 s | | the rotation of said ampule being around its longitudinal axis.

2. A method as claimed in claim 1 characterized in that the bottom of the ampoule is substantially flat.

3. A method as claimed in claim 1 characterized in that the crystalline cadmium mercury telluride has a composition defined by the formula $Cd_xHg_{1-x}Te$ and that $0.4 \geq x \geq 0.15$.

4. A method as claimed in claim 1 characterized in that the crystalline cadmium mercury telluride is grown at a rate of approximately 0.5 mm per hour.

* * * * *